United States Patent
Kwak et al.

(10) Patent No.: US 6,788,106 B2
(45) Date of Patent: Sep. 7, 2004

(54) INTEGRATED CIRCUIT DEVICES HAVING DATA INVERSION CIRCUITS THEREIN THAT REDUCE SIMULTANEOUS SWITCHING NOISE AND SUPPORT INTERLEAVING OF PARALLEL DATA

(75) Inventors: Jin-seok Kwak, Kyungki-do (KR); Seong-jin Jang, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/397,773

(22) Filed: Mar. 26, 2003

(65) Prior Publication Data

US 2004/0066213 A1 Apr. 8, 2004

(30) Foreign Application Priority Data

Oct. 5, 2002 (KR) ................................. 10-2002-0060815

(51) Int. Cl.[7] ............................. G06F 7/50; H03K 19/21
(52) U.S. Cl. ......................... 326/52; 365/233; 714/758; 714/801
(58) Field of Search ............................. 326/52, 41, 39; 365/219, 233, 233.5; 714/758, 801, 800, 802, 805; 710/65

(56) References Cited

U.S. PATENT DOCUMENTS

| | | | | |
|---|---|---|---|---|
| 4,462,102 A | * | 7/1984 | Povlick | 714/801 |
| 5,477,551 A | * | 12/1995 | Parks et al. | 714/758 |
| 5,931,927 A | * | 8/1999 | Takashima | 710/65 |
| 6,456,551 B2 | * | 9/2002 | Sohn et al. | 365/219 |
| 6,731,567 B2 | * | 5/2004 | Acharya et al. | 365/233 |

* cited by examiner

Primary Examiner—Patrick Wamsley
(74) Attorney, Agent, or Firm—Myers Bigel Sibley & Sajovec

(57) ABSTRACT

Integrated circuit devices include data inversion circuits therein that are configured to evaluate at least first and second ordered groups of input data in parallel with an ordered group of output data previously generated by the data inversion circuit. The data inversion circuit is further configured to generate inverted versions of the first and second ordered groups of input data whenever a number of bit differences between the first ordered group of input data and the ordered group of output data is greater than one-half a size of the first ordered group of input data and a number of bit differences between the second ordered group of input data and the inverted version of the first ordered group of input data is greater than one-half a size of the second ordered group of input data, respectively.

28 Claims, 7 Drawing Sheets

INTEGRATED CIRCUIT DEVICES HAVING DATA INVERSION CIRCUITS THEREIN THAT REDUCE SIMULTANEOUS SWITCHING NOISE AND SUPPORT INTERLEAVING OF PARALLEL DATA

REFERENCE TO PRIORITY APPLICATION

This application claims priority to Korean Application Serial No. 2002-60815, filed Oct. 5, 2002, the disclosure of which is hereby incorporated herein by reference.

FIELD OF THE INVENTION

The present invention relates to integrated circuit devices and, more particularly, to integrated circuit devices having high data bandwidth.

BACKGROUND OF THE INVENTION

Integrated circuit devices that support high data bandwidth may suffer from simultaneous switching noise (SSN), particularly when switching a plurality of output pins or driving groups of parallel signal lines (e.g., buses) at high frequency. Conventional techniques to reduce SSN have included the use of data inversion circuits that operate to limit the number of parallel data signals that switch value during consecutive data output cycles. For example, FIG. 1 illustrates a conventional data inversion circuit 100 that includes an input XOR circuit 110, a data comparator 130 and an output XOR circuit 120. The input XOR circuit 110 receives a plurality of current input signals FDO1–FDO8 and a plurality of prior output signals DO1–DO8, which are fed back from parallel output pins of the data inversion circuit 100. The XOR logic gates within the input XOR circuit 110 generate a plurality of signals that are provided to inputs of the data comparator 130. This data comparator 130 is configured to generate a single parity signal (S) having a logic value equal to 1 whenever a number of bit differences ($\Delta$) between the data pairs (FDO1, DO1), (FDO2, DO2), (FD31, DO3), (FDO4, DO4), (FDO5, DO5), (FDO6, DO6), (FDO7, DO7) and (FDO8, DO8) is greater than or equal to four (4). Thus, if the prior value of DO1–DO8=[00000000] and the new value of FDO1–FDO8=[11111110], then the parity signal S will have a value of 1 because $\Delta$=7. In this case, the new output signals DO1–DO8 will equal [00000001], which means that only one of the output pins will switch value between the old and new output signals. The parity signal S will also be provided as an output of the data inversion circuit 100 so that the circuit or device receiving the output signals can properly interpret their values. In contrast, if the prior value of DO1–DO8=[00001111] and the new value of FDO1–FDO8=[00000001], then the parity signal S will have a value of 0 because $\Delta$=3. In this case, no data inversion operation will be performed by the output XOR circuit 120 and the new output signals DO1–DO8 will be generated as [00000001].

Another conventional technique for reducing SSN in integrated circuits that output parallel signals to a data bus is disclosed in U.S. Pat. No. 5,931,927 to Takashima. In particular, FIG. 3 of the '927 patent illustrates an input/output device that generates an m-bit data signal and a single bit parity signal to a bus. Half of the m-bit data signal may be inverted if necessary to make the number of "1" signal values more nearly equivalent to the number of "0" signal values that are generated during an output cycle. In particular, the '927 patent shows a Circuit A (left side) and a Circuit A (right side), with each circuit receiving ½m bits of data. If the Circuit A (left side) and the Circuit A (right side) all receive logic 1 signals, then the parity outputs from the two circuits will be equal to "1", which reflects the fact that more "1s" than "0s" are present. When this occurs, a data inversion flag, which is generated by an exclusive XNOR gate, will be set to a logic 1 value. When the data inversion flag is set to a logic 1 value, then the outputs of the Circuit A (right side) will be inverted by the data inversion circuit. Accordingly, the output buffer (left side) will receive all "1s" from the Circuit A (left side) and the output buffer (right side) will receive all "0s" from the data inversion circuit. A single-bit output buffer will also generate a flag signal (F1) so that the inversion of the data from the Circuit A (right side) can be properly interpreted once the data is passed to the bus.

Thus, in FIG. 3 of the '927 patent, if the m-bit data signal provided to circuit A (left side) and circuit A (right side) during a first cycle is: 11111000 and 00000111 and the m-bit data signal provided during a second cycle is: 00000111 and 11111000, then the data inversion flag will not be set and the m-bit data provided to the bus during consecutive cycles will be:

$1^{st}$ cycle: 1 1 1 1 1 0 0 0   0 0 0 0 0 1 1 1
            ↓ ↓ ↓ ↓ ↓ ↓ ↓ ↓   ↓ ↓ ↓ ↓ ↓ ↓ ↓ ↓   $\Delta$ = 16
$2^{nd}$ cycle: 0 0 0 0 0 1 1 1   1 1 1 1 1 0 0 0

Thus, using the circuit of FIG. 3 of the '927 patent, the number of "1s" and "0s" generated during the first cycle are equivalent (at eight each) and the number of "1s" and "0s" generated during the second cycle are also equivalent (at eight each). However, the number of bit differences ($\Delta$) from the first cycle to the second cycle will equal a maximum of sixteen (i.e., $\Delta$=16), which means that all output signal lines to the bus will be switched high-to-low or low-to-high when passing from the first cycle to the second cycle. This high level of switching can lead to unacceptable simultaneous switching noise, even if the total number of "1s" and the total number of "0s" during the first and second cycles is maintained at about an equivalent level.

Accordingly, notwithstanding these conventional techniques for reducing simultaneous switching noise, there continues to be a need for data inversion circuits that can handle high data bandwidths with high degrees of immunity from SSN.

SUMMARY OF THE INVENTION

Integrated circuit devices according to embodiments of the present invention reduce simultaneous switching noise (SSN) when performing high data bandwidth switching operations. These devices also enable the interleaving of data onto data pins in a serial format from data that was originally generated and processed in a parallel format. The parallel format data may be generated within a memory device, such as a dual data rate (DDR) memory device with 4-bit prefetch, or other device that is configured to drive a plurality of signal lines with parallel streams of data, including bus driver circuitry.

In some embodiments of the present invention, a data inversion circuit is provided that processes new data in parallel and also evaluates the new data relative to previously generated output data, which is fed back as an input to the data inversion circuit. In particular, the data inversion circuit is configured to evaluate bit differences between the first and second ordered groups of data received in parallel at inputs thereof by performing bit-to-bit comparisons between corresponding bits in the first and second ordered groups of data. The data inversion circuit is further configured to generate a version of the first ordered group of data in parallel with an inverted version of the second ordered group of data at outputs thereof when a number of bit differences between the version of the first ordered group of data and the second ordered group of data is greater than one-half the number of bits of data within the second ordered group of data. The version of the first ordered group of data may be a noninverted version or an inverted version of the data.

To reduce the delay of a timing critical path associated with the data inversion circuit, a plurality of essentially parallel timing paths are provided in some embodiments of the present invention. In particular, the data inversion circuit may be configured to include a first XOR circuit that is configured to receive the first and second ordered groups of data received in parallel at the inputs of the data inversion circuit. A second XOR circuit is also provided. The second XOR circuit is configured to receive an inverted version of the first ordered group of data and the second ordered group of data. The inverted version of the first ordered group of data may be generated by an inverter circuit.

The data inversion circuit may also include a first comparator that is configured to generate a noninverted parity signal (NPi) in response to signals generated by the first XOR circuit, and a second comparator that is configured to generate an inverted parity signal (IPi) in response to signals generated by the second XOR circuit. A selector circuit may also be provided. The selector circuit is configured to generate a second parity signal (S2) in response to a first parity signal (S1) and the noninverted and inverted parity signals (NPi and IPi). The selector circuit is preferably configured so that the noninverted parity signal (NPi) is selected as the second parity signal when the first parity signal is false (e.g., S1=0) and the inverted parity signal (IPi) is selected as the second parity signal when the first parity signal is true (e.g., S1=1).

Integrated circuit devices according to further embodiments of the present invention include a data inversion circuit that is configured to evaluate at least first and second ordered groups of current input data in parallel with an ordered group of prior output data. In particular, the data inversion circuit includes primarily combinational logic that is configured to output inverted or non-inverted versions of the first and second ordered groups of current input data as first and second ordered groups of current output data, respectively. This primarily combinational logic is configured to maintain a number of bit inversions (Δ) between the ordered group of prior output data and the first ordered group of current output data at less than or equal to one-half a size of the first ordered group of current output data. The logic is also configured to maintain a number of bit inversions between the first ordered group of current output data and the second ordered group of current output data at less than or equal to one-half a size of the second ordered group of current output data. In this manner, the number of signal lines or pins that undergo switching from one cycle to the next cycle can be kept relatively small to thereby inhibit simultaneous switching noise.

DETAILED DESCRIPTION OF PREFERRED EMBODIMENTS

Figure 1:
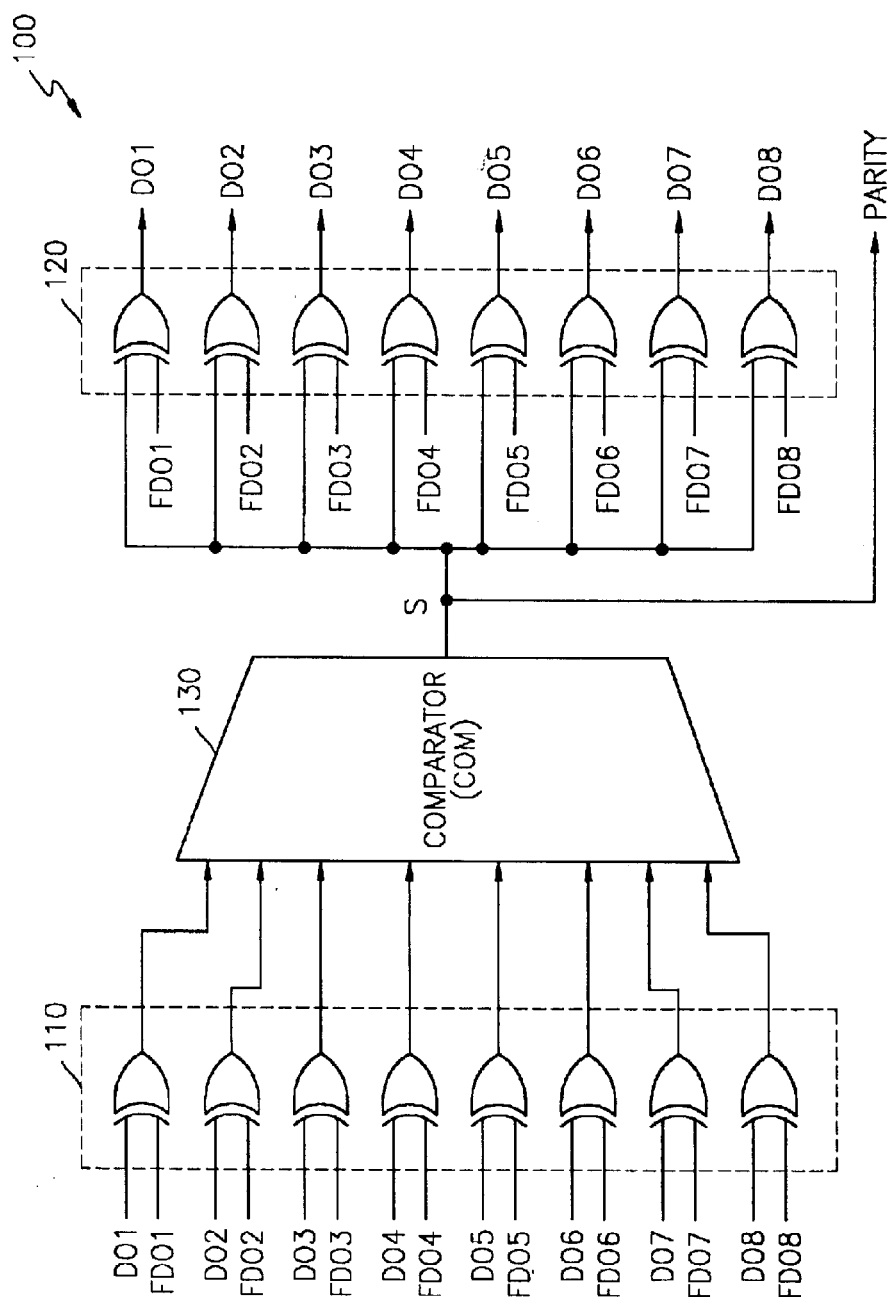
FIG. 1 is an electrical schematic of a data inversion circuit according to the prior art.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

Figure 2:
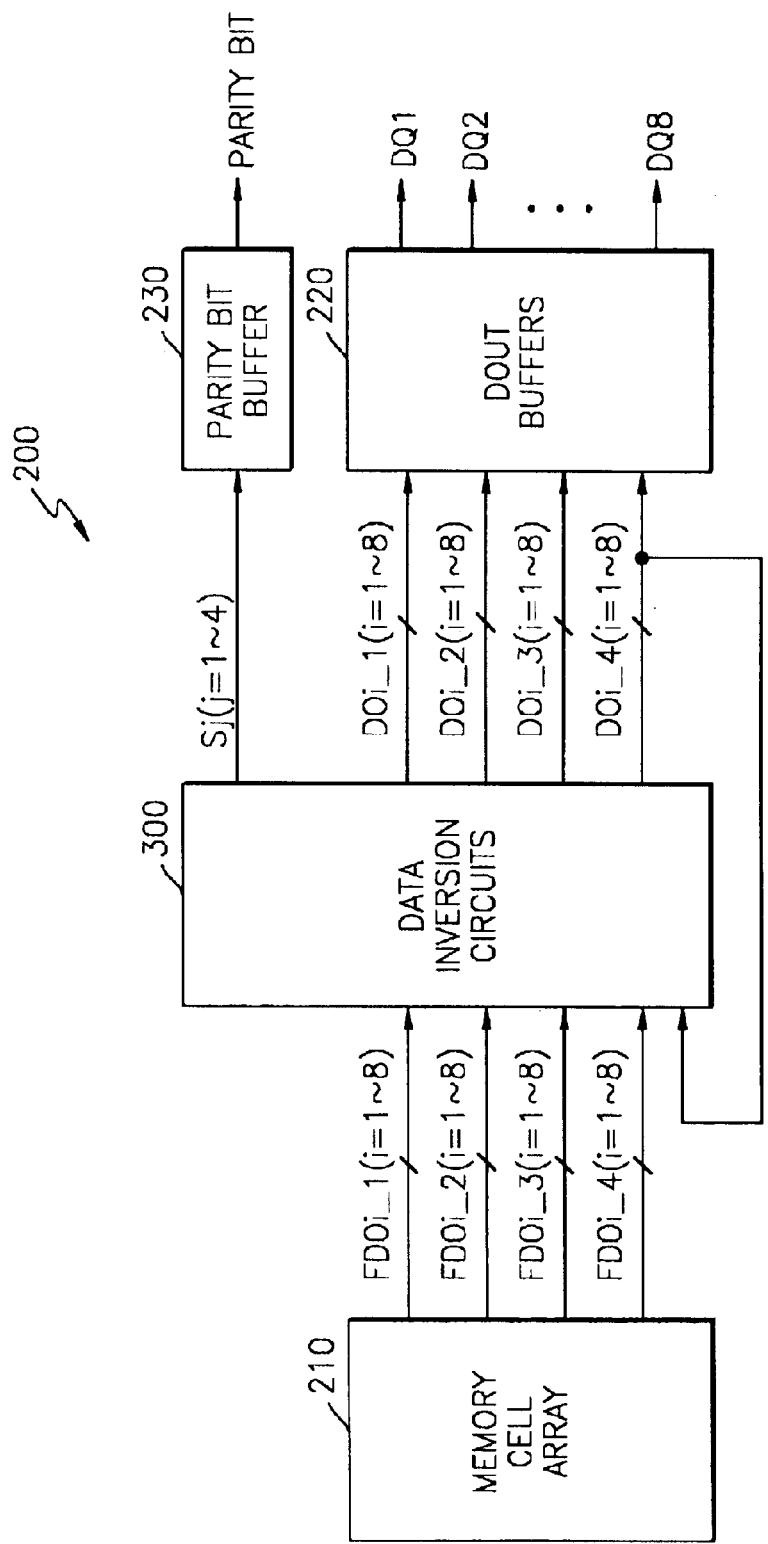
FIG. 2 is an electrical schematic of an integrated circuit device according to one embodiment of the present invention.

Referring now to FIG. 2, an integrated circuit device 200 according to an embodiment of the present invention includes a memory cell array 210, a data inversion circuit 300, a parity bit buffer 230 and an output data buffer 220. According to one aspect of this embodiment, the integrated circuit device 200 is a dual data rate (DDR) memory device and the memory cell array 210 is configured to support a 4-bit prefetch operation in response to a read instruction. In particular, the memory cell array 210 may have sufficient capacity and bus width to support a read operation that generates 32-bits of parallel data. These 32-bits are shown as FDOi_1 through FDOi_4 (i=1 to 8). As illustrated by TABLE 1, which is described more fully hereinbelow, these 32-bits of data may be read from the memory cell array 210 in-sync, with a leading edge (e.g., rising edge) of a clock signal having a period equal to T, where 2T represents the time interval between consecutive operations to read parallel data from the memory cell array 210.

The data inversion circuit 300 is configured to generate data output signals DOi_1 through DOi_4 (i=1 to 8) and parity bit signals Sj (j=1 to 4) in parallel. As illustrated, the data output signals DOi_4 are fed back as inputs to the data inversion circuit 300. Thus, in the illustrated embodiment, the data inversion circuit 300 is configured to generate 32 data output signals [DO1_1:DO8_1], [DO1_2:DO8_2], [DO1_3:DO8_3] and [DO1_4:DO8_4] in response to 32 data input signals [FDO1_1:FDO8_1], [FDO1_2:FDO8_2], [FDO1_3:FDO8_3] and [FDO1_4:FDO8_4] and eight (8) data output signals [DO1_4:DO8_4], which are provided as feed back. A data output buffer 220 and parity bit buffer 230 are also provided. The data output buffer 220 is configured to receive the data output signals DOi_1 through DOi_4 (i=1 to 8) in parallel. The data output buffer 220 is configured to interleave each of the four groups of data output signals and provide the interleaved signals to a plurality of data output pins DQ1–DQ8, as illustrated and described more fully hereinbelow with respect to TABLE 2. The parity bit buffer 230 is configured to receive the parity bit signals Sj (j=1 to 4) in parallel and to interleave these signals in serial format onto an output parity signal line (shown as PARITY BIT). A parity bit signal equal to "1" indicates that the corresponding data on the output pins DQ1–DQ8 has been inverted. A parity bit signal equal to "0" indicates that the corresponding data on the output pins DQ1–DQ8 has not been inverted.

Operation of the data inversion circuit 300 according to some embodiments of the present invention will now be described with reference to TABLE 1. In particular, TABLE 1 illustrates the operation of the data inversion circuit 300 at five points in time, shown as $0^-$, $0^+$, $2T^+$, $4T^+$ and $6T^+$, where "T" represents the period of a clock signal (not shown) and $0^-$ and $0^+$ represent time points just shortly before and after an initial leading edge of the clock signal, respectively. The time points $2T^+$, $4T^+$ and $6T^+$ represent time points just shortly after respective leading edges of the clock signal, which are spaced by time intervals equal to two clock periods. The entries within TABLE 1 that have been highlighted (i.e., italicized) represent data strings that have undergone data inversion.

The data inversion circuit 300 performs data comparison operations between four ordered groups of data and, if necessary, performs a data inversion operation if a number of bit differences between two consecutive groups of data is greater than one-half the number of bits of data within the group. These operations can be understood more fully by analyzing the entries of TABLE 1.

As a first example, TABLE 1 illustrates that at time $0^-$, the eight bits of output data associated with group 4 (i.e., DO1_4 to DO8_4) equal [10111100] and at time $0^+$, the eight bits of input data associated with group 1 (i.e., FDO1_1 to FDO8_1) equal [11110100]. A data comparison operation between these two 8-bit strings reveals a "less than four" (<4) bit difference (Δ):

| DO1_4 to DO8_4 | FDO1_1 to FDO8_1 | Δ |
|---|---|---|
| 1 | 1 | No |
| 0 | 1 | Yes |
| 1 | 1 | No |
| 1 | 1 | No |
| 1 | 0 | Yes |
| 1 | 1 | No |
| 0 | 0 | No |
| 0 | 0 | No |

Thus, in the first example where Δ=2, only two (2) bit differences are detected during the data comparison, which means that the output data associated with group 1 (i.e., DO1_1 to DO8_1) will not be inverted (i.e., [FDO1_1:FDO8_1] equals [DO1_1:DO8_1] at time $0^+$ and the first parity signal S1=0).

As a second example, TABLE 1 illustrates that at time $0^+$, the eight bits of output data associated with group 1 (i.e., DO1_1 to DO8_1) equal [11110100] and at time $0^+$, the eight bits of input data associated with group 2 (i.e., FDO1_2 to FDO8_2) equal [11011010]. A data comparison operation between these two 8-bit strings reveals a "not less than four" (i.e., ≧4) bit difference (Δ):

TABLE 1

| TIME = 0− | TIME = 0+<br>(S1–S4 = 0, 1, 0, 1) | | TIME = 2T+<br>(S1–S4 = 1, 1, 0, 0) | | TIME = 4T+<br>(S1–S4 = 1, 1, 0, 0) | | TIME = 6T+<br>(S1–S4 = 1, 0, 1, 0) | |
|---|---|---|---|---|---|---|---|---|
| — | FDO1_1 = 1 | DO1_1 = 1 | FDO1_1 = 1 | *DO1_1 = 0* | FDO1_1 = 1 | *DO1_1 = 0* | FDO1_1 = 0 | *DO1_1 = 1* |
| — | FDO2_1 = 1 | DO2_1 = 1 | FDO2_1 = 1 | *DO2_1 = 0* | FDO2_1 = 1 | *DO2_1 = 0* | FDO2_1 = 0 | *DO2_1 = 1* |
| — | FDO3_1 = 1 | DO3_1 = 1 | FDO3_1 = 0 | *DO3_1 = 1* | FDO3_1 = 0 | *DO3_1 = 1* | FDO3_1 = 1 | *DO3_1 = 0* |
| — | FDO4_1 = 1 | DO4_1 = 1 | FDO4_1 = 0 | *DO4_1 = 1* | FDO4_1 = 0 | *DO4_1 = 1* | FDO4_1 = 1 | *DO4_1 = 0* |
| — | FDO5_1 = 0 | DO5_1 = 0 | FDO5_1 = 1 | *DO5_1 = 0* | FDO5_1 = 0 | *DO5_1 = 1* | FDO5_1 = 0 | *DO5_1 = 1* |
| — | FDO6_1 = 1 | DO6_1 = 1 | FDO6_1 = 0 | *DO6_1 = 1* | FDO6_1 = 0 | *DO6_1 = 1* | FDO6_1 = 0 | *DO6_1 = 1* |
| — | FDO7_1 = 0 | DO7_1 = 0 | FDO7_1 = 0 | *DO7_1 = 1* | FDO7_1 = 1 | *DO7_1 = 0* | FDO7_1 = 1 | *DO7_1 = 0* |
| — | FDO8_1 = 0 | DO8_1 = 0 | FDO8_1 = 1 | *DO8_1 = 0* | FDO8_1 = 1 | *DO8_1 = 0* | FDO8_1 = 0 | *DO8_1 = 1* |
| — | FDO1_2 = 1 | *DO1_2 = 0* | FDO1_2 = 1 | *DO1_2 = 0* | FDO1_2 = 1 | *DO1_2 = 0* | FDO1_2 = 1 | DO1_2 = 1 |
| — | FDO2_2 = 1 | *DO2_2 = 0* | FDO2_2 = 1 | *DO2_2 = 0* | FDO2_2 = 1 | *DO2_2 = 0* | FDO2_2 = 1 | DO2_2 = 1 |
| — | FDO3_2 = 0 | *DO3_2 = 1* | FDO3_2 = 1 | *DO3_2 = 0* | FDO3_2 = 0 | *DO3_2 = 1* | FDO3_2 = 0 | DO3_2 = 0 |
| — | FDO4_2 = 1 | *DO4_2 = 0* | FDO4_2 = 1 | *DO4_2 = 0* | FDO4_2 = 1 | *DO4_2 = 0* | FDO4_2 = 0 | DO4_2 = 0 |
| — | FDO5_2 = 1 | *DO5_2 = 0* | FDO5_2 = 0 | *DO5_2 = 0* | FDO5_2 = 0 | *DO5_2 = 1* | FDO5_2 = 1 | DO5_2 = 1 |
| — | FDO6_2 = 0 | *DO6_2 = 1* | FDO6_2 = 0 | *DO6_2 = 0* | FDO6_2 = 1 | *DO6_2 = 0* | FDO6_2 = 1 | DO6_2 = 1 |
| — | FDO7_2 = 1 | *DO7_2 = 0* | FDO7_2 = 0 | *DO7_2 = 1* | FDO7_2 = 0 | *DO7_2 = 1* | FDO7_2 = 1 | DO7_2 = 1 |
| — | FDO8_2 = 0 | *DO8_2 = 1* | FDO8_2 = 0 | *DO8_2 = 1* | FDO8_2 = 1 | *DO8_2 = 0* | FDO8_2 = 1 | DO8_2 = 1 |
| — | FDO1_3 = 0 | DO1_3 = 0 | FDO1_3 = 0 | DO1_3 = 0 | FDO1_3 = 1 | DO1_3 = 1 | FDO1_3 = 0 | *DO1_3 = 1* |
| — | FDO2_3 = 0 | DO2_3 = 0 | FDO2_3 = 1 | DO2_3 = 1 | FDO2_3 = 0 | DO2_3 = 0 | FDO2_3 = 1 | *DO2_3 = 0* |
| — | FDO3_3 = 0 | DO3_3 = 0 | FDO3_3 = 1 | DO3_3 = 1 | FDO3_3 = 0 | DO3_3 = 0 | FDO3_3 = 0 | *DO3_3 = 0* |
| — | FDO4_3 = 0 | DO4_3 = 0 | FDO4_3 = 0 | DO4_3 = 0 | FDO4_3 = 0 | DO4_3 = 0 | FDO4_3 = 0 | *DO4_3 = 1* |
| — | FDO5_3 = 0 | DO5_3 = 0 | FDO5_3 = 0 | DO5_3 = 0 | FDO5_3 = 1 | DO5_3 = 1 | FDO5_3 = 0 | *DO5_3 = 1* |
| — | FDO6_3 = 1 | DO6_3 = 1 | FDO6_3 = 0 | DO6_3 = 0 | FDO6_3 = 0 | DO6_3 = 0 | FDO6_3 = 1 | *DO6_3 = 0* |
| — | FDO7_3 = 1 | DO7_3 = 1 | FDO7_3 = 0 | DO7_3 = 0 | FDO7_3 = 1 | DO7_3 = 1 | FDO7_3 = 1 | *DO7_3 = 0* |
| — | FDO8_3 = 0 | DO8_3 = 0 | FDO8_3 = 1 | DO8_3 = 1 | FDO8_3 = 1 | DO8_3 = 1 | FDO8_3 = 0 | *DO8_3 = 1* |
| DO1_4 = 1 | FDO1_4 = 1 | *DO1_4 = 0* | FDO1_4 = 0 | DO1_4 = 0 | FDO1_4 = 0 | DO1_4 = 0 | FDO1_4 = 1 | DO1_4 = 1 |
| DO2_4 = 0 | FDO2_4 = 1 | *DO2_4 = 0* | FDO2_4 = 0 | DO2_4 = 0 | FDO2_4 = 0 | DO2_4 = 0 | FDO2_4 = 0 | DO2_4 = 0 |
| DO3_4 = 1 | FDO3_4 = 1 | *DO3_4 = 0* | FDO3_4 = 0 | DO3_4 = 1 | FDO3_4 = 0 | DO3_4 = 0 | FDO3_4 = 0 | DO3_4 = 0 |
| DO4_4 = 1 | FDO4_4 = 0 | *DO4_4 = 1* | FDO4_4 = 0 | DO4_4 = 0 | FDO4_4 = 0 | DO4_4 = 0 | FDO4_4 = 0 | DO4_4 = 0 |
| DO5_4 = 1 | FDO5_4 = 1 | *DO5_4 = 0* | FDO5_4 = 1 | DO5_4 = 1 | FDO5_4 = 1 | DO5_4 = 1 | FDO5_4 = 1 | DO5_4 = 1 |
| DO6_4 = 1 | FDO6_4 = 1 | *DO6_4 = 0* | FDO6_4 = 1 | DO6_4 = 1 | FDO6_4 = 0 | DO6_4 = 0 | FDO6_4 = 0 | DO6_4 = 0 |
| DO7_4 = 0 | FDO7_4 = 0 | *DO7_4 = 1* | FDO7_4 = 0 | DO7_4 = 0 | FDO7_4 = 0 | DO7_4 = 0 | FDO7_4 = 0 | DO7_4 = 0 |
| DO8_4 = 0 | FDO8_4 = 0 | *DO8_4 = 1* | FDO8_4 = 0 | DO8_4 = 0 | FDO8_4 = 1 | DO8_4 = 1 | FDO8_4 = 1 | DO8_4 = 1 |

| DO1_1 to DO8_1 | FDO1_2 to FDO8_2 | Δ |
|---|---|---|
| 1 | 1 | No |
| 1 | 1 | No |
| 1 | 0 | Yes |
| 1 | 1 | No |
| 0 | 1 | Yes |
| 1 | 0 | Yes |
| 0 | 1 | Yes |
| 0 | 0 | No |

Thus, in the second example where Δ=4, four (4) bit differences are detected during the data comparison, which means that the output data associated with group 2 (i.e., DO1_1 to DO8_1) will be inverted (i.e., [DO1_2:DO8_2] is inverted relative to [FDO1_2:FDO8_2] at time 0+ and the second parity signal S2=1).

As a third example, TABLE 1 illustrates that at time 0+, the eight bits of output data associated with group 2 (i.e., DO1_2 to DO8_2) equal [00100101] and at time $0^+$, the eight bits of input data associated with group 3 (i.e., FDO1_3 to FDO8_3) equal [00000110]. A data comparison operation between these two 8-bit strings reveals a "less than four" (<4) bit difference (Δ):

| DO1_2 to DO8_2 | FDO1_3 to FDO8_3 | Δ |
|---|---|---|
| 0 | 0 | No |
| 0 | 0 | No |
| 1 | 0 | Yes |
| 0 | 0 | No |
| 0 | 0 | No |
| 1 | 1 | No |
| 0 | 1 | Yes |
| 1 | 0 | Yes |

Thus, in the third example where Δ=3, only three (3) bit differences are detected during the data comparison, which means that the output data associated with group 3 (i.e., DO1_3 to DO8_3) will not be inverted (i.e., [FDO1_3:FDO8_3] equals [DO1_3:DO8_3] at time 0+ and the third parity signal S3=0).

As a fourth example, TABLE 1 illustrates that at time $0^+$, the eight bits of output data associated with group 3 (i.e., DO1_3 to DO8_3) equal [00000110] and at time $0^+$, the eight bits of input data associated with group 4 (i.e., FDO1_4 to FDO8_4) equal [11101100]. A data comparison operation between these two 8-bit strings reveals a "not less than four" (i.e., ≧4) bit difference (Δ):

| DO1_3 to DO8_3 | FDO1_4 to FDO8_4 | Δ |
|---|---|---|
| 0 | 1 | Yes |
| 0 | 1 | Yes |
| 0 | 1 | Yes |
| 0 | 0 | No |
| 0 | 1 | Yes |
| 1 | 1 | No |
| 1 | 0 | Yes |
| 0 | 0 | No |

Thus, in the fourth example where Δ=5, five (5) bit differences are detected during the data comparison, which means that the output data associated with group 4 (i.e., DO1_4 to DO8_4) will be inverted (i.e., [DO1_4:DO8_4] is inverted relative to [FDO1_4:FDO8_4] at time $0^+$ and the fourth parity signal S4=1).

As a fifth example, TABLE 1 illustrates that at time $4T^+$, the eight bits of output data associated with group 1 (i.e., DO1_1 to DO8_1) equal [00111100] and at time $0^+$, the eight bits of input data associated with group 2 (i.e., FDO1_2 to FDO8_2) equal [11010101]. A data comparison operation between these two 8-bit strings reveals a "not less than four" (i.e., ≧4) bit difference (Δ):

| DO1_1 to DO8_1 | FDO1_2 to FDO8_2 | Δ |
|---|---|---|
| 0 | 1 | Yes |
| 0 | 1 | Yes |
| 1 | 0 | Yes |
| 1 | 1 | No |
| 1 | 0 | Yes |
| 1 | 1 | No |
| 0 | 0 | No |
| 0 | 1 | Yes |

Thus, in the fifth example where Δ=5, five (5) bit differences are detected during the data comparison, which means that the output data associated with group 2 (i.e., DO1_2 to DO8_2) will be inverted (i.e., [DO1_2:DO8_2] is inverted relative to [FDO1_2:FDO8_2] at time $4T^+$ and the second parity signal S2=1).

As a sixth and final example, TABLE 1 illustrates that at time $6T^+$, the eight bits of output data associated with group 3 (i.e., DO1_3 to DO8_3) equal [10011001] and at time $6T^+$, the eight bits of input data associated with group 4 (i.e., FDO1_4 to FDO8_4) equal [10011001]. A data comparison operation between these two 8-bit strings reveals a "less than four" (<4) bit difference (Δ):

| DO1_3 to DO8_3 | FDO1_4 to FDO8_4 | Δ |
|---|---|---|
| 1 | 1 | No |
| 0 | 0 | No |
| 0 | 0 | No |
| 1 | 1 | No |
| 1 | 1 | No |
| 0 | 0 | No |
| 0 | 0 | No |
| 1 | 1 | No |

Thus, in the sixth example where Δ=0, no bit differences are detected during the data comparison, which means that the output data associated with group 4 (i.e., DO1_4 to DO8_4) will not be inverted (i.e., [FDO1_4:FDO8_4] equals [DO1_4:DO8_4] at time $6T^+$ and the fourth parity signal S4=0).

The eight groups of inverted and non-inverted output data illustrated by TABLE 1 at time points $0^+$ and $2T^+$ can be read out from the output buffer 220 on consecutive rising and falling edges of a clock signal, which are spaced by time intervals equal to ½T. In particular, TABLE 2 illustrates how the ordered groups of parallel output data ((DO1_1:DO8_1), (DO1_2:DO8_2), (DO1_3:DO8_3) and (DO1_4:DO8_4)) are interleaved onto a plurality of output pins DQ1–DQ8. Thus, at time points t=0, 0.5T, 1T and 1.5T, each of the output pins DQ1–DQ8 receives four bits of serial data, which were originally read in parallel from the memory cell array 210. For example, the first output pin DQ1 generates the following repeating serial sequence of data bits: (DO1_1, DO1_2, DO1_3, DO1_4, DO1_1, DO1_4, . . . ) As with TABLE 1, the entries within TABLE 2 that are highlighted (by italics) represent data that has been inverted in order to reduce simultaneous switching noise (SSN) in the integrated circuit device 200. The parity bits (Sj) associated with the inverted entries are shown as having a logic 1 value. Accordingly, as illustrated by TABLE 2, at no point does the switching of the eight (8) bits of data on output pins DQ1–DQ8 result in more than 4 pins being switched high-to-low or low-to-high.

FDO2_2), (DO3_1, FDO3_2), (DO4_1, FDO4_2), (DO5_1, FDO5_2), (DO6_1, FDO6_2), (DO7_1, FDO7_2) and (DO8_1, FDO8_2)}. The XOR logic circuit 702 generates a multi-bit output (shown as 8-bits) which is provided as an input to a comparator 712. The comparator 712 may be equivalent in construction to the comparator

TABLE 2

| PINS | t = 0+ | t = 0.5T+ | t = 1T+ | t = 1.5T+ | t = 2T+ | t = 2.5T+ | t = 3T+ | t = 3.5T+ |
|---|---|---|---|---|---|---|---|---|
| PARITY (Sj) | S1 = 0 | S2 = 1 | S3 = 0 | S4 = 1 | S1 = 1 | S2 = 1 | S3 = 0 | S4 = 0 |
| DQ1 | DO1_1 = 1 | *DO1_2 = 0* | DO1_3 = 0 | *DO1_4 = 0* | *DO1_1 = 0* | *DO1_2 = 0* | DO1_3 = 0 | DO1_4 = 0 |
| DQ2 | DO2_1 = 1 | *DO2_2 = 0* | DO2_3 = 0 | *DO2_4 = 0* | *DO2_1 = 0* | *DO2_2 = 0* | DO2_3 = 1 | DO2_4 = 0 |
| DQ3 | DO3_1 = 1 | *DO3_2 = 1* | DO3_3 = 0 | *DO3_4 = 0* | *DO3_1 = 1* | *DO3_2 = 0* | DO3_3 = 1 | DO3_4 = 1 |
| DQ4 | DO4_1 = 1 | *DO4_2 = 0* | DO4_3 = 0 | *DO4_4 = 1* | *DO4_1 = 1* | *DO4_2 = 0* | DO4_3 = 0 | DO4_4 = 0 |
| DQ5 | DO5_1 = 0 | *DO5_2 = 0* | DO5_3 = 0 | *DO5_4 = 0* | *DO5_1 = 0* | *DO5_2 = 0* | DO5_3 = 0 | DO5_4 = 1 |
| DQ6 | DO6_1 = 1 | *DO6_2 = 1* | DO6_3 = 1 | *DO6_4 = 0* | *DO6_1 = 0* | *DO6_2 = 1* | DO6_3 = 1 | DO6_4 = 1 |
| DQ7 | DO7_1 = 0 | *DO7_2 = 0* | DO7_3 = 1 | *DO7_4 = 1* | *DO7_1 = 1* | *DO7_2 = 1* | DO7_3 = 0 | DO7_4 = 0 |
| DQ8 | DO8_1 = 0 | *DO8_2 = 1* | DO8_3 = 0 | *DO8_4 = 1* | *DO8_1 = 0* | *DO8_2 = 1* | DO8_3 = 1 | DO8_4 = 0 |

Figure 7:
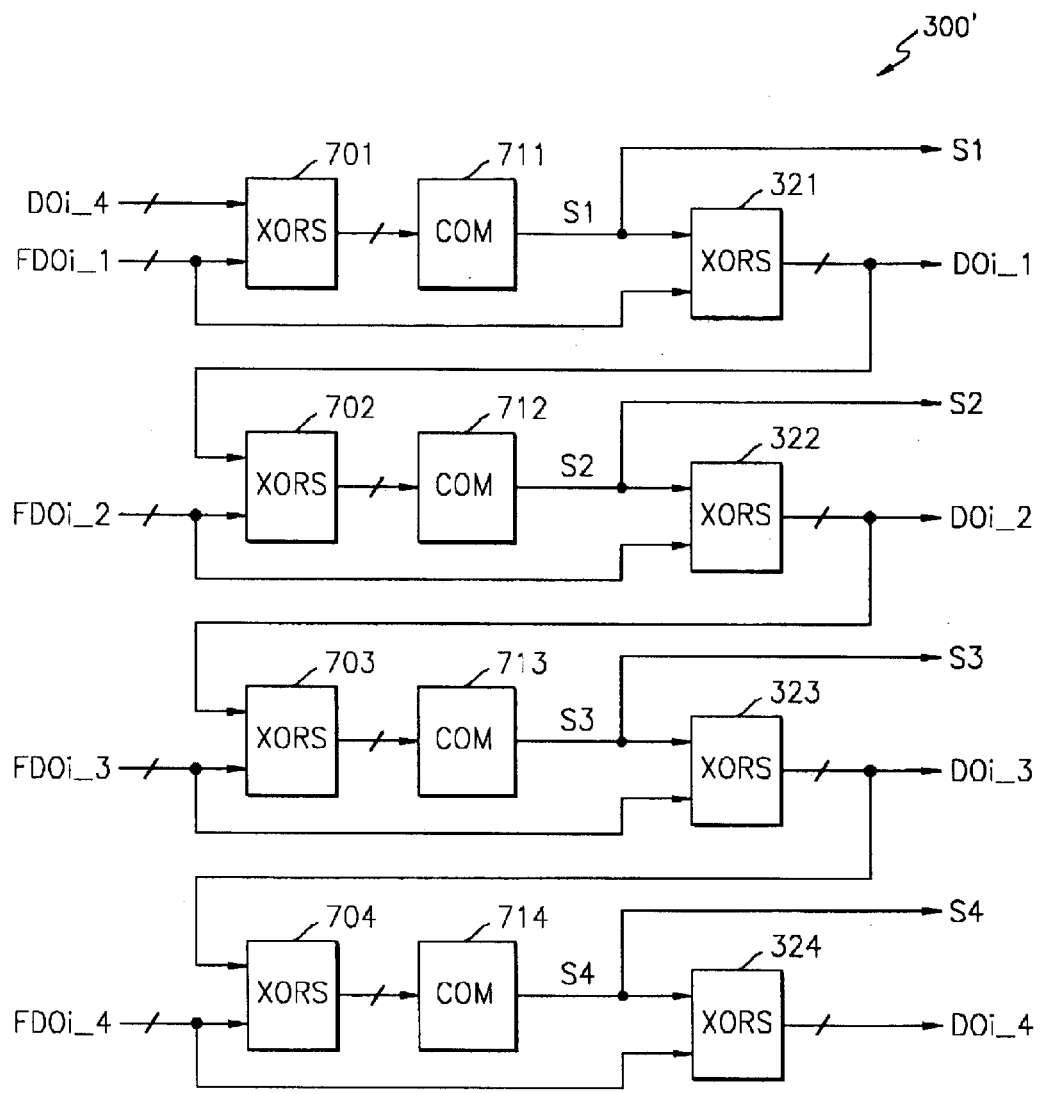
FIG. 7 is an alternative data inversion circuit that can be used in the device of FIG. 2.

Referring now to FIG. 7, a data inversion circuit 300' according to one embodiment of the present invention includes primarily combinational logic. As illustrated, the data inversion circuit 300' includes a plurality of XOR logic circuits 701–704 and 321–324. The XOR logic circuit 701 may be similar to the XOR logic circuit 110 of FIG. 1. In particular, the XOR logic circuit 701 may comprise eight (8) 2-input XOR logic gates that are configured to receive the first ordered group of input signals FDOi_1 and the fourth ordered group of output signals DOi_4, where i=1 to 8. These signals will be paired at each XOR gate logic in the following sequence: {(DO1_4, FDO1_1), (DO2_4, FDO2_1), (DO3_4, FDO3_1), (DO4_4, FDO4_1), (DO5_4, FDO5_1), (DO6_4, FDO6_1), (DO7_4, FDO7_1) and (DO8_4, FDO8_1)}. The XOR logic circuit 701 generates a multi-bit output (shown as 8-bits), which is provided as an input to a comparator 711. The comparator 711 may be equivalent in construction to the comparator 130 of FIG. 1. In particular, the comparator 711 may be configured to generate a single bit parity signal (shown as S1) having a logic 1 value when a number of bit differences (Δ) between FDOi_1 and DOi_4 is greater than (or equal to) four (4) (i.e., not less than four) and a logic 0 value when the number of bit differences is less than four. Alternatively, equivalent simultaneous switching noise can be achieved by designing the comparator 711 so that the single bit parity signal S1 has a logic 1 value when a number of bit differences between FDOi_1 and DOi_4 is greater than four (4) (i.e., Δ>4) and a logic 0 value when the number of bit differences is not greater than four (i.e., Δ≦4).

The XOR logic circuit 321 is configured to receive the first parity signal S1 and the first ordered group of input signals FDOi_1. The XOR logic circuit 321 may be equivalent in construction to the XOR logic circuit 120 of FIG. 1. When the first parity signal S1 is set to a logic 1 value, then the first ordered group of output signals DOi_1 will equal /(FDOi_1), where "/" represents a data inversion operation. Alternatively, when the first parity signal S1 is set to a logic 0 value, then DOi_1=FDOi_1, which operate as feed back signals. These operations are also illustrated by TABLE 1 and the aforementioned examples.

The XOR logic circuit 702 may also comprise eight (8) 2-input XOR logic gates that are configured to receive the second ordered group of input signals FDOi_2 and the first ordered group of output signals DOi_1. These signals will be paired at each of the eight XOR logic gates in the following sequence: {(DO1_1, FDO1_2), (DO2_1, 711. In particular, the comparator 712 may be configured to generate a single bit parity signal (shown as S1) having a logic 1 value when a number of bit differences (Δ) between FDOi_2 and DOi_1 is greater than (or equal to) four (4) (i.e., not less than four) and a logic 0 value when the number of bit differences is less than four. The XOR logic circuit 322 is configured to receive the second parity signal S2 and the second ordered group of input signals FDOi_2. The XOR logic circuit 322 may be equivalent in construction to the XOR logic circuit 321. When the second parity signal S2 is set to a logic 1 value, then the second ordered group of output signals DOi_2 will equal /(FDOi_2). Alternatively, when the second parity signal S2 is set to a logic 0 value, then DOi_2=FDOi_2 and no inversion takes place.

The XOR logic circuit 703 in FIG. 7 may comprise eight (8) 2-input XOR logic gates that are configured to receive the third ordered group of input signals FDOi_3 and the second ordered group of output signals DOi_2, which operate as feed back signals. These signals will be paired at each of the eight XOR logic gates in the following sequence: {(DO1_2, FDO1_3), (DO2_2, FDO2_3), (DO3_2, FDO3_3), (DO4_2, FDO4_3), (DO5_2, FDO5_3), (DO6_2, FDO6_3), (DO7_2, FDO7_3) and (DO8_2, FDO8_3)}. The XOR logic circuit 703 generates a multi-bit output (shown as 8-bits) which is provided as an input to a comparator 713. The comparator 713 may be equivalent in construction to the comparator 712. In particular, the comparator 713 may be configured to generate a single bit parity signal (shown as S3) having a logic 1 value when a number of bit differences (Δ) between FDOi_3 and DOi_2 is greater than (or equal to) four (4) (i.e., not less than four) and a logic 0 value when the number of bit differences is less than four. The XOR logic circuit 323 is configured to receive the third parity signal S3 and the third ordered group of input signals FDOi_3. The XOR logic circuit 323 may be equivalent in construction to the XOR logic circuit 322. When the third parity signal S3 is set to a logic 1 value, then the third ordered group of output signals DOi_3 will equal /(FDOi_3). Alternatively, when the third parity signal S3 is set to a logic 0 value, then DOi_3=FDOi_3 and no inversion takes place.

Finally, the XOR logic circuit 704 in FIG. 7 may comprise eight (8) 2-input XOR logic gates that are configured to receive the fourth ordered group of input signals FDOi_4 and the third ordered group of output signals DOi_3. These signals will be paired at each of the eight XOR logic gates in the following sequence: {(DO1_3, FDO1_4), (DO2_3, FDO2_4), (DO3_3, FDO3_4), (DO4_3, FDO4_4), (DO5_3, FDO5_4), (DO6_3, FDO6_4), (DO7_3, FDO7_4) and (DO8_3, FDO8_4}. The XOR logic circuit 704 generates a multi-bit output (shown as 8-bits) which is provided as an input to a comparator 714. The comparator 714 may be equivalent in construction to the comparator 713. In particular, the comparator 714 may be configured to generate a single bit parity signal (shown as S4) having a logic 1 value when a number of bit differences (Δ) between FDOi_4 and DOi_3 is greater than (or equal to) four (4) (i.e., not less than four) and a logic 0 value when the number of bit differences is less than four. The XOR logic circuit 324 is configured to receive the fourth parity signal S4 and the fourth ordered group of input signals FDOi_4. The XOR logic circuit 324 may be equivalent in construction to the XOR logic circuit 323. When the fourth parity signal S4 is set to a logic 1 value, then the fourth ordered group of output signals DOi_4 will equal /(FDOi_4). Alternatively, when the fourth parity signal S4 is set to a logic 0 value, then DOi_4=FDOi_4.

The timing performance of the data inversion circuit 300' of FIG. 7 may be limited by the fact that the timing critical path passes though all four XOR logic circuits 701–704. Thus, four serial traversals of the logic elements (701, 711 and 321), (702, 712 and 322), (703, 713 and 323) and (704, 714 and 324) will be required before the output signals DOi_4 become valid.

Figure 3:
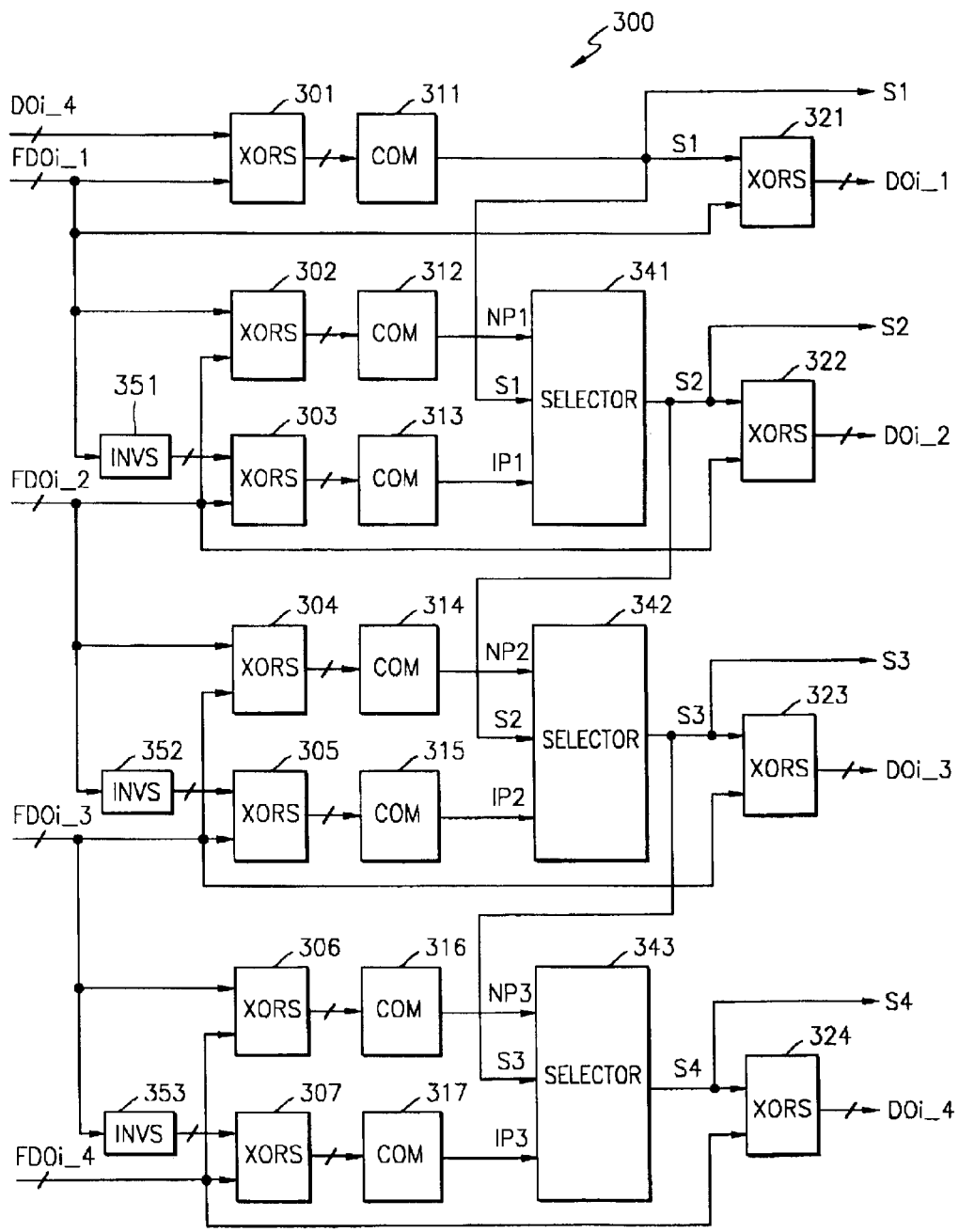
FIG. 3 is a block diagram of a data inversion circuit that can be used in the device of FIG. 2.

To address this timing performance limitation, which may be significant in a high frequency device application, the data inversion circuit 300 of FIG. 3 is provided as a more preferred embodiment. In particular, the data inversion circuit 300 of FIG. 3 includes seven (7) timing paths that essentially operate in parallel when generating the output signals DOi_1 to DOi_4. The first timing path includes the series combination of the XOR logic circuit 301, the comparator 311 and the XOR logic circuit 321. A detailed electrical schematic of these three circuits is more fully illustrated by FIG. 4. The second timing path includes the combination of the XOR logic circuit 302, the comparator 312, the selector circuit 341 and the XOR logic circuit 322. The third timing path includes the combination of the inverter circuit 351, the XOR logic circuit 303, the comparator 313, the selector circuit 341 and the XOR logic circuit 322. A detailed electrical schematic of the second and third timing paths is more fully illustrated by FIG. 5. The fourth timing path includes the combination of the XOR logic circuit 304, the comparator 314, the selector circuit 342 and the XOR logic circuit 323. The fifth timing path includes the combination of the inverter circuit 352, the XOR logic circuit 305, the comparator 315, the selector circuit 342 and the XOR logic circuit 323. The sixth timing path includes the combination of the XOR logic circuit 306, the comparator 316, the selector circuit 343 and the XOR logic circuit 324. The seventh timing path includes the combination of the inverter circuit 353, the XOR logic circuit 307, the comparator 317, the selector circuit 343 and the XOR logic circuit 324. The operation of these timing paths will now be described in greater detail.

Figure 4:
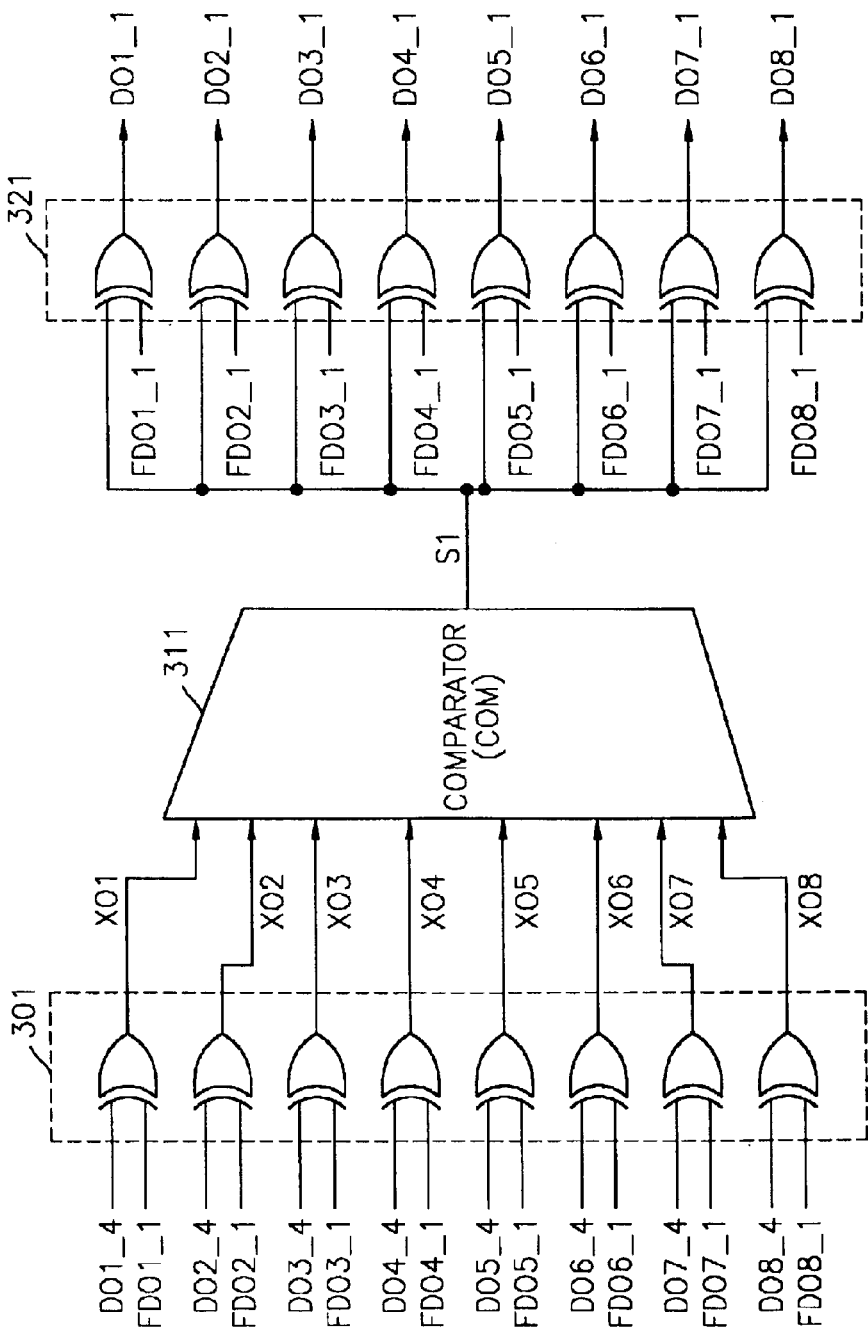
FIG. 4 is an electrical schematic of elements that make up a first timing path in the data inversion circuit of FIG. 3.
Figure 6:
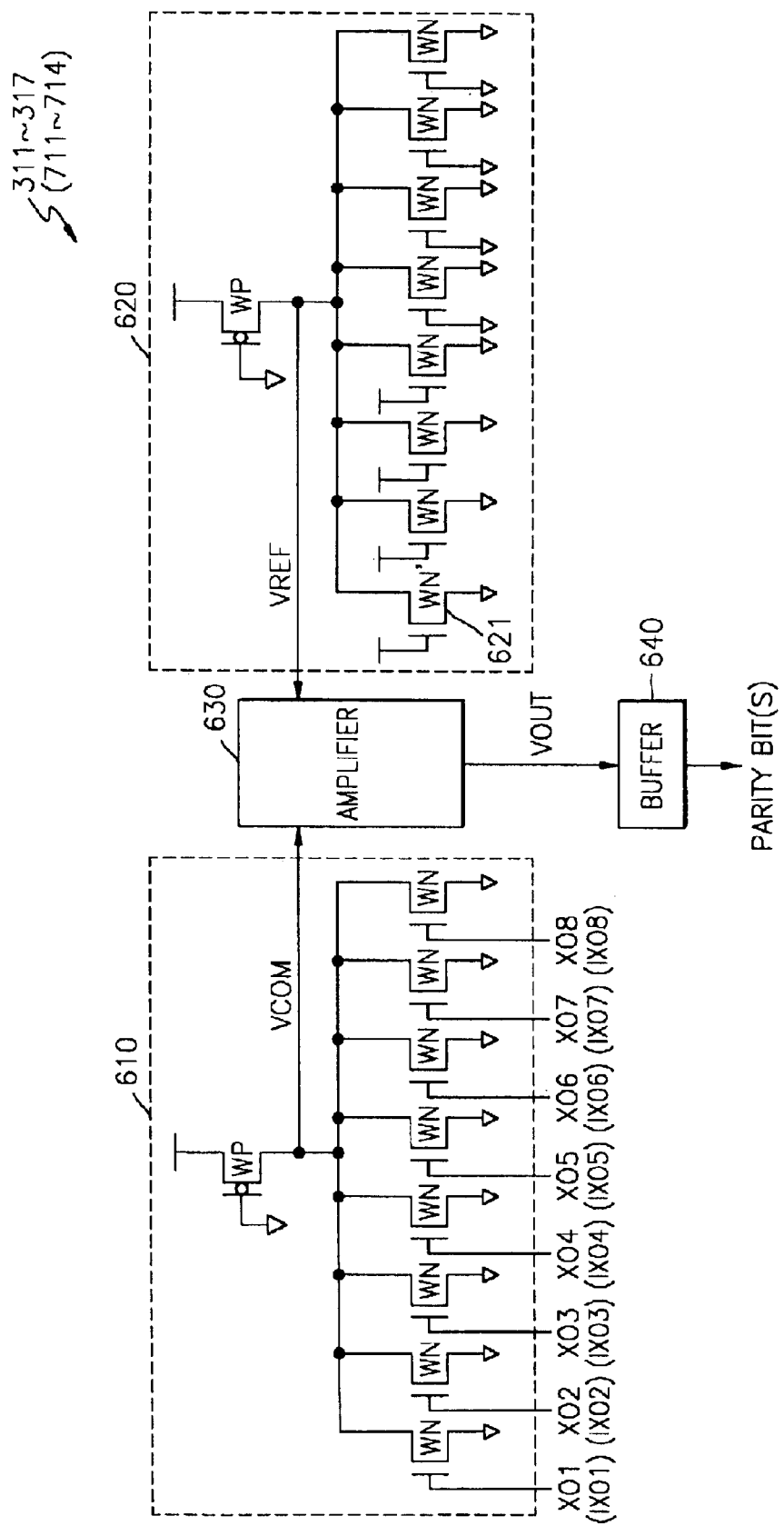
FIG. 6 is an electrical schematic of a data comparator that may be used in the data inversion circuit of FIG. 3.

The first timing path, which is illustrated in greater detail in FIG. 4, is similar to the timing path illustrated by the XOR circuit 701, the comparator 711 and the XOR circuit 321 illustrated by FIG. 7. In particular, the first timing path of FIG. 3 includes the XOR circuit 301, the comparator 311 and the XOR circuit 321. The comparators 311–317 in FIG. 3 and the comparators 711–714 in FIG. 7 are more fully illustrated in FIG. 6. In particular, the comparator of FIG. 6 includes a comparing circuit 610, a reference circuit 620, a differential amplifier 630 and a buffer 640 that generates a parity bit signal (S1–S4) in response to an output signal VOUT generated by the differential amplifier 630. The reference circuit 620 includes a plurality of normally-on NMOS pull-down transistors 621 (having widths equal to WN' or WN) and the comparing circuit 610 includes a plurality of NMOS pull-down transistors (have widths equal to WN) that are responsive to either XOR signals (XO1–XO8) generated by XOR circuits 302, 304 or 306 or "inverted" XOR signals (IXO1–IXO8) generated by XOR circuits 303, 305 and 307. The reference circuit 620 generates a reference voltage VREF and includes a relatively weak normally-on PMOS pull-up transistor (having width WP). The comparing circuit 610 generates a compare voltage VCOM and includes a relatively weak normally-on PMOS pull-up transistor (having width WP). The comparing circuit 610 is configured so that the compare voltage VCOM is pulled below the reference voltage VREF (and the output signal VOUT switches low-to-high) whenever the number of bit differences between two eight bit operands (e.g., FDOi_1 and DOi_4) is greater than or equal to four (i.e., the number of XOR signals XO1–XO8 (or IXO1–IXO8) having a logic 1 value is greater than or equal to 4). These aspects of the comparators are more fully described in Korean Application Serial No. 2002-67002, filed Oct. 31, 2002, the disclosure of which is hereby incorporated by reference. The aforementioned U.S. Pat. No. 5,931,927 also discloses comparator circuits (see, e.g., FIGS. 6–8).

Referring now to FIG. 4, the first timing path is illustrated as including an XOR circuit 301, a comparator 311 (see, FIG. 6) and an XOR circuit 321. The XOR circuit 301 is configured to receive the first ordered group of input signals FDOi_1 and the fourth ordered group of output signals DOi_4, which are fed back from outputs of the data inversion circuit 300 of FIG. 3. The XOR circuit 301 generates XOR signals XO1–XO8 which are set to logic 1 values if a bit difference is present between respective pairs of the received input and output signals (FDOi_1 and DOi_4). As described above with respect to FIG. 6, the comparator 311 generates a first parity signal S1 having a logic 1 value if four (or more) of the XOR signals XO1–XO8 are set to logic 1 values and a logic 0 value if three or less of the XOR signals are set to logic 1 values. The first parity signal S1 is provided as an input to the XOR circuit 321. If S1=0 (i.e., S1 is false), then the first ordered group of output signals DO1_1 through DO8_1 of the XOR circuit 321 will match the values of the first ordered group of input signals FDO1_1 through FDO8_1 and no data inversion will take place. Alternatively, if S1=1 (i.e., S1 is true), then the first ordered group of output signals DO1_1 through DO8_1 of the XOR circuit 321 will be inverted relative to the first ordered group of input signals FDO1_1 through FDO8_1.

Figure 5:
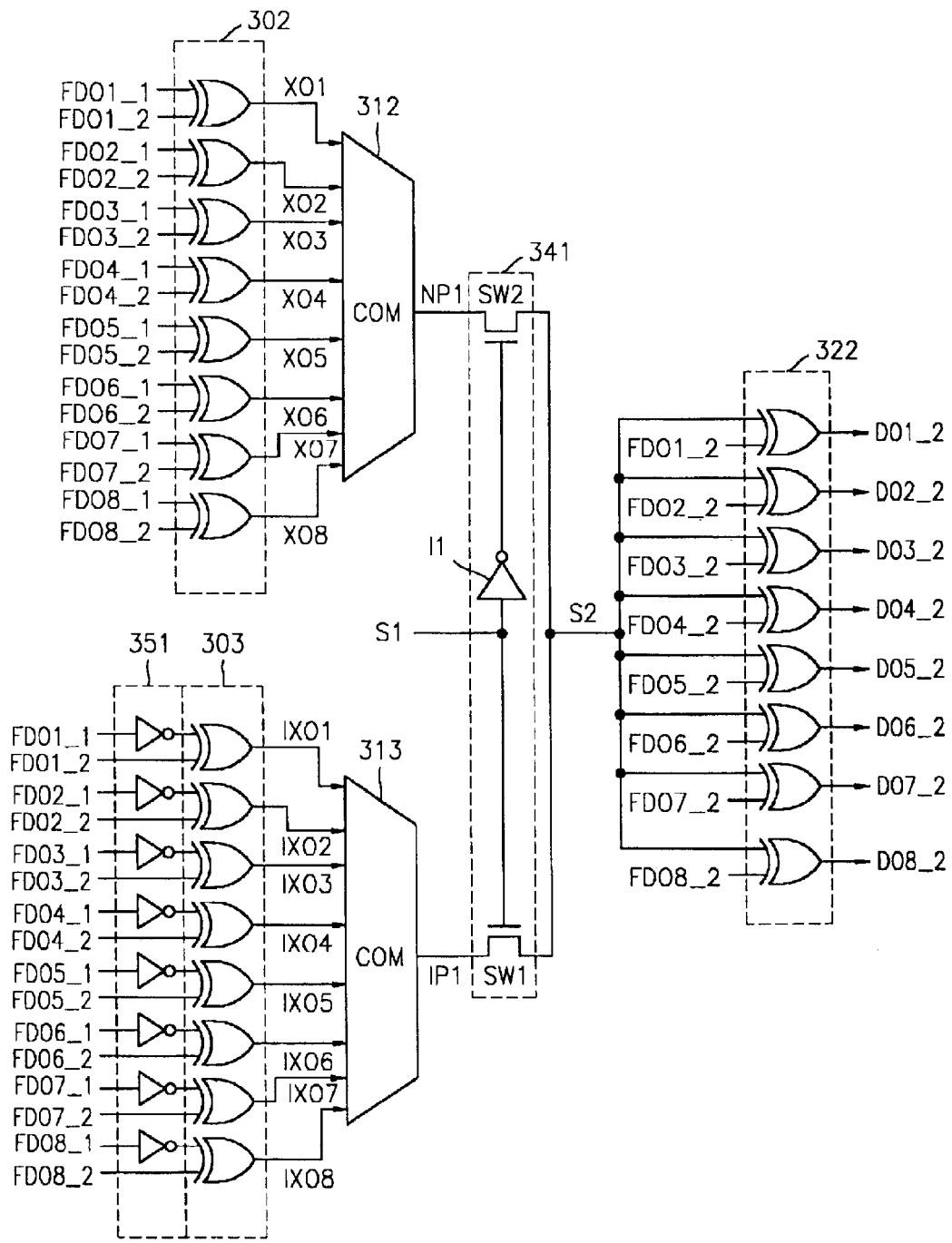
FIG. 5 is an electrical schematic of elements that make up the second and third timing paths in the data inversion circuit of FIG. 3.

The first parity signal S1, which is provided as an output of the data inversion circuit 300, is also provided as an input to the selector circuit 341, which is associated with the second and third timing paths. As illustrated by FIG. 5, which provides details of the second and third timing paths, the selector circuit 341 is illustrated as including two NMOS pass transistors (shown as SW1 and SW2) and an inverter 11. When the first parity signal S1 is set to a logic 1 value (i.e., true), then the first NMOS transistor SW1 will select the output IP1 ("inverted parity") of the comparator 313 as the second parity signal S2. Alternatively, if the first parity signal S1 is set to a logic 0 value (i.e., false), then the second NMOS transistor SW2 will select the output NP1 ("noninverted parity") of the comparator 312 as the second parity signal S2.

In FIG. 5, the output NP1 of the comparator 312 is generated at a logic 1 value if the number of bit differences between the first and second ordered groups of input signals FDOi_1 and FDOi_2 is greater than or equal to four (4). Alternatively, the output IP1 of the comparator 313 is generated at a logic 1 value if the number of bit differences between an inverted version of the first ordered group of input signals (i.e., /FDOi_1) and the second ordered group of input signals FDOi_2 is greater than or equal to four (4). The inverted version of the first ordered group of input signals (i.e., /FDOi_1), which is generated by the inverter circuit 351, is equivalent to the first ordered group of output signals DOi_1 when the first parity signal S1 is set to a logic 1 value.

Thus, the comparators 312 and 313 generate two signals NP1 and IP1 in parallel and the selector circuit 341 selects between the two as soon as the first parity signal S1 becomes valid. In particular, if S1=1, then S2=IP1, but if S1=0, then S2=NP1. Thus, the selector circuit 341 is configured to perform the following operations:

If S1=1, then DOi_1=/FDOi_1; and S2=IP1=1 if and only if Δ between /FDOi_1 and FDOi_2 is ≧4; or If S1=0, then DOi_1=FDOi_1; and S2=NP1=1 if and only if Δ between FDOi_1 and FDOi_2 is ≧4.

The selector circuit 341 generates the second parity signal S2, which is provided as an input to the XOR circuit 322. Thus, if S2=1, then DOi_2=/FDOi_2, but if S2=0, then DOi_2=FDOi_2 (see also, TABLE 1).

The second parity signal S2 is provided as an output of the data inversion circuit 300 and is also provided as a feed back input to the selector circuit 342. When the second parity signal S2 is set to a logic 1 value, then the selector circuit 342 will select the output IP2 ("inverted parity) of the comparator 315 as the third parity signal S3. Alternatively, if the second parity signal S2 is set to a logic 0 value, then the selector circuit 342 will select the output NP2 ("noninverted parity") of the comparator 314 as the third parity signal S3. The output NP2 of the comparator 314 is generated at a logic 1 value if the number of bit differences between the second and third ordered groups of input signals FDOi_2 and FDOi_3 is greater than or equal to four (4). Alternatively, the output IP2 of the comparator 315 is generated at a logic 1 value if the number of bit differences between an inverted version of the second ordered group of input signals (i.e., /FDOi_2) and the third ordered group of input signals FDOi_3 is greater than or equal to four (4). The inverted version of the second ordered group of input signals (i.e., /FDOi_2), which is generated by the inverter circuit 352, is equivalent to the second ordered group of output signals DOi_2 when the second parity signal S2 is set to a logic 1 value.

Thus, the comparators 314 and 315 generate two signals NP2 and IP2 in parallel and the selector circuit 342 selects between the two as soon as the second parity signal S2 becomes valid. In particular, if S2=1, then the third parity signal S3=IP2, but if S2=0, then S3=NP2. Thus, the selector circuit 342 is configured to perform the following operations:

If S2=1, then DOi_2=/FDOi_2; and S3=IP2=1 if and only if Δ between /FDOi_2 and FDOi_3 is ≧4; or If S2=0, then DOi_2=FDOi_2; and S3=NP2=1 if and only if Δ between FDOi_2 and FDOi_3 is ≧4.

The selector circuit 342 generates the third parity signal S3, which is provided as an input to the XOR circuit 323. Thus, if S3=1, then DOi_3=/FDOi_3, but if S3=0, then DOi_3=FDOi_3 (see also, TABLE 1).

The third parity signal S3 is provided as an output of the data inversion circuit 300 and is provided as a feedback input to the selector circuit 343. When the third parity signal S3 is set to a logic 1 value, then the selector circuit 343 will select the output IP3 ("inverted parity") of the comparator 317 as the fourth parity signal S4. Alternatively, if the third parity signal S3 is set to a logic 0 value, then the selector circuit 343 will select the output NP3 ("noninverted parity") of the comparator 316 as the fourth parity signal S4. The output NP3 of the comparator 316 is generated at a logic 1 value if the number of bit differences between the third and fourth ordered groups of input signals FDOi_3 and FDOi_4 is greater than or equal to four (4). Alternatively, the output IP3 of the comparator 317 is generated at a logic 1 value if the number of bit differences between an inverted version of the third ordered group of input signals (i.e., /FDOi_3) and the fourth ordered group of input signals FDOi_4 is greater than or equal to four (4). The inverted version of the third ordered group of input signals (i.e., /FDOi_3), which is generated by the inverter circuit 353, is equivalent to the third ordered group of output signals DOi_3 when the third parity signal S3 is set to a logic 1 value.

Thus, the comparators 316 and 317 generate two signals NP3 and IP3 in parallel and the selector circuit 343 selects between the two as soon as the third parity signal S3 becomes valid. In particular, if S3=1, then the fourth parity signal S4=IP3, but if S3=0, then S4=NP3. Thus, the selector circuit 343 is configured to perform the following operations:

If S3=1, then DOi_3=/FDOi_3; and S4=IP3=1 if and only if Δ between /FDOi_3 and FDOi_4 is ≧4; or If S3=0, then DOi_3=FDOi_3; and S4=NP3=1 if and only if Δ between FDOi_3 and FDOi_4 is ≧4.

The selector circuit 343 generates the fourth parity signal S4, which is provided as an input to the XOR circuit 324. Thus, if S4=1, then DOi_4=/FDOi_4, but if S4=0, then DOi_4=FDOi_4 (see also, TABLE 1).

By designing the data inversion circuit 300 of FIG. 2 in accordance with the design of FIG. 3 instead of the design of FIG. 7, the timing critical path can be shortened and improved speed performance can be achieved. In particular, the data inversion circuit 300 of FIG. 3 has a timing critical path that spans only the XOR circuits 301 and 321 and comparator 311 in the first timing path and the selector circuits 341–343 and XOR circuits 322–324 in the second through seventh timing paths. Thus, by using additional circuitry that generates the signals (NP1, IP1), (NP2, IP2) and (NP3, IP3) in parallel, and then selecting from these signals in sequence as the values of S1, S2, S3 and S4 are computed, the delay between the generation of first ordered group of output signals DOi_1 and the fourth ordered group of output signals DOi_4 can be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:

a data inversion circuit that is configured to evaluate bit differences between first and second ordered groups of data received in parallel at inputs thereof by performing bit-to-bit comparisons between corresponding bits in the first and second ordered groups of data, and is further configured to generate a version of the first ordered group of data in parallel with an inverted version of the second ordered group of data at outputs thereof when a number of bit differences between the version of the first ordered group of data and the second ordered group of data is greater than one-half the number of bits of data within the second ordered group of data.

2. The device of claim 1, wherein said data inversion circuit comprises:
a first timing path that is configured to generate a first parity signal and the version of the first ordered group of data at the outputs of said data inversion circuit.

3. The device of claim 2, wherein said data inversion circuit further comprises:
a first XOR circuit that is configured to receive the first and second ordered groups of data received in parallel at the inputs of said data inversion circuit; and
a second XOR circuit that is configured to receive the second ordered group of data and an inverted version of the first ordered group of data.

4. The device of claim 3, further comprising:
a first comparator that is configured to generate a noninverted parity signal in response to signals generated by said first XOR circuit; and
a second comparator that is configured to generate an inverted parity signal in response to signals generated by said second XOR circuit.

5. The device of claim 4, further comprising a selector circuit that is configured to generate a second parity signal in response to the first parity signal and the noninverted and inverted parity signals.

6. The device of claim 5, wherein said selector circuit is configured so that the noninverted parity signal is selected as the second parity signal when the first parity signal is false and the inverted parity signal is selected as the second parity signal when the first parity signal is true.

7. The device of claim 6, wherein said selector circuit is configured so that the noninverted parity signal is selected as the second parity signal when the first parity signal is a logic 0 value and the inverted parity signal is selected as the second parity signal when the first parity signal is a logic 1 value.

8. The device of claim 1, wherein said data inversion circuit comprises:
a first XOR circuit that is configured to receive the first and second ordered groups of data received in parallel at the inputs of said data inversion circuit; and
a second XOR circuit that is configured to receive the second ordered group of data and an inverted version of the first ordered group of data.

9. The device of claim 8, further comprising:
a first comparator that is configured to generate a noninverted parity signal in response to signals generated by said first XOR circuit; and
a second comparator that is configured to generate an inverted parity signal in response to signals generated by said second XOR circuit.

10. The device of claim 9, further comprising a selector circuit that is configured to generate a second parity signal in response to a first parity signal and the noninverted and inverted parity signals.

11. The device of claim 10, wherein said selector circuit is configured so that the noninverted parity signal is selected as the second parity signal when the first parity signal is false and the inverted parity signal is selected as the second parity signal when the first parity signal is true.

12. An integrated circuit device, comprising:
a data inversion circuit that is configured to evaluate at least first and second ordered groups of input data in parallel with a last ordered group of output data previously generated by said data inversion circuit, and is further configured to output inverted versions of the first and second ordered groups of input data whenever a number of bit differences between the first ordered group of input data and the last ordered group of output data is greater than one-half a size of the first ordered group of input data and a number of bit differences between the second ordered group of input data and the inverted version of the first ordered group of input data is greater than one-half a size of the second ordered group of input data, respectively.

13. The device of claim 12, wherein said data inversion circuit comprises:
a first XOR circuit that is configured to receive the first ordered group of input data and the last ordered group of output data;
a first comparator that is configured to generate a first parity signal in response to signals generated by said first XOR circuit; and
a second XOR circuit that is configured to receive the first parity signal and the first ordered group of input data.

14. The device of claim 13, wherein said data inversion circuit further comprises:
a third XOR circuit that is configured to receive the first and second ordered groups of input data; and
a fourth XOR circuit that is configured to receive the second ordered group of input data and an inverted version of the first ordered group of input data.

15. The device of claim 14, further comprising:
a second comparator that is configured to generate a noninverted parity signal in response to signals generated by said third XOR circuit; and
a third comparator that is configured to generate an inverted parity signal in response to signals generated by said fourth XOR circuit.

16. The device of claim 15, further comprising a selector circuit that is configured to generate a second parity signal in response to the first parity signal and the noninverted and inverted parity signals.

17. The device of claim 16, wherein said selector circuit is configured so that the noninverted parity signal is selected as the second parity signal when the first parity signal is false and the inverted parity signal is selected as the second parity signal when the first parity signal is true.

18. A dual data rate (DDR) memory device, comprising:
a memory cell array that is configured to support a 4-bit prefetch operation in response to a read instruction; and
a data inversion circuit that is configured to evaluate bit differences between first and second ordered groups of data received in parallel at inputs thereof by performing bit-to-bit comparisons between corresponding bits in the first and second ordered groups of data, and is further configured to generate a version of the first ordered group of data in parallel with an inverted version of the second ordered group of data at outputs thereof when a number of bit differences between the version of the first ordered group of data and the second ordered group of data is greater than one-half the number of bits of data within the second ordered group of data.

19. The memory device of claim 18, further comprising:
a data output buffer that is configured to perform a parallel-to-serial conversion of the version of the first ordered group of data and the inverted version of the second ordered group of data, and is further configured to drive a plurality of output pins of the memory device with the version of the first ordered group of data during a first edge of a clock signal and then drive the plurality of output pins with the inverted version of the second ordered group of data during a second edge of the clock signal.

20. The memory device of claim 19, wherein the first and second edges of the clock signal are consecutive rising and falling edges of the clock signal.

21. The memory device of claim 18, wherein said data inversion circuit is further configured to evaluate bit differences between the first and second ordered groups of data in parallel with an ordered group of output data previously generated by said data inversion circuit.

22. An integrated circuit device, comprising:
a data inversion circuit that is configured to evaluate at least first and second ordered groups of current input data in parallel with an ordered group of prior output data, said data inversion circuit comprising logic that is configured to output inverted or non-inverted versions of the first and second ordered groups of current input data as first and second ordered groups of current output data, respectively, in order to maintain a number of bit inversions between the ordered group of prior output data and the first ordered group of current output data at less than or equal to one-half a size of the first ordered group of current output data and also maintain a number of bit inversions between the first ordered group of current output data and the second ordered group of current output data at less than or equal to one-half a size of the second ordered group of current output data.

23. The device of claim 22, wherein said data inversion circuit comprises:
a first XOR circuit that is configured to receive the first and second ordered groups of current input data; and
a second XOR circuit that is configured to receive the second ordered group of current input data and an inverted version of the first ordered group of current input data.

24. The device of claim 23, further comprising:
a first comparator that is configured to generate a noninverted parity signal in response to signals generated by said first XOR circuit; and
a second comparator that is configured to generate an inverted parity signal in response to signals generated by said second XOR circuit.

25. The device of claim 24, further comprising a selector circuit that is configured to generate a second parity signal in response to a first parity signal and the noninverted and inverted parity signals.

26. The device of claim 25, wherein said selector circuit is configured so that the noninverted parity signal is selected as the second parity signal when the first parity signal is false and the inverted parity signal is selected as the second parity signal when the first parity signal is true.

27. The device of claim 22, wherein said data inversion circuit is further configured to generate at least a first parity signal that indicates whether or not the first ordered group of current output data is an inverted or non-inverted version of the first ordered group of current input data.

28. The device of claim 22, wherein said data inversion circuit is configured to internally generate an inverted version of the first ordered group of current input data; and wherein the logic comprises a first XOR circuit that is configured to perform a bit-by-bit comparison between the first ordered group of current input data and the second ordered group of current input data and second XOR circuit that is configured to perform a bit-by-bit comparison between the inverted version of the first ordered group of current input data and the second ordered group of current input data.

* * * * *